United States Patent
Ohmi et al.

(10) Patent No.: US 7,459,720 B2
(45) Date of Patent: Dec. 2, 2008

(54) SINGLE CRYSTAL WAFER AND SOLAR BATTERY CELL

(75) Inventors: Tadahiro Ohmi, Miyagi (JP); Shigetoshi Sugawa, Miyagi (JP); Tatsuo Ito, Gunma (JP); Koichi Kanaya, Gunma (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 10/332,434

(22) PCT Filed: Jul. 6, 2001

(86) PCT No.: PCT/JP01/05892

§ 371 (c)(1),
(2), (4) Date: Jan. 8, 2003

(87) PCT Pub. No.: WO02/05335

PCT Pub. Date: Jan. 17, 2002

(65) Prior Publication Data

US 2003/0160304 A1 Aug. 28, 2003

(30) Foreign Application Priority Data

Jul. 10, 2000 (JP) .............................. 2000-208870

(51) Int. Cl.
*H01L 29/04* (2006.01)
(52) U.S. Cl. .................... 257/28; 257/627; 257/628; 257/E21.23; 257/E21.193; 257/E21.244
(58) Field of Classification Search .......... 257/627–628, 257/461, 28, 640; 438/724
See application file for complete search history.

(56) References Cited

U.S. PATENT DOCUMENTS

| | | | | |
|---|---|---|---|---|
| 3,925,107 A | * | 12/1975 | Gdula et al. | 438/471 |
| 4,463,216 A | * | 7/1984 | Nakano et al. | 136/256 |
| 5,067,985 A | * | 11/1991 | Carver et al. | 136/255 |
| 5,071,785 A | * | 12/1991 | Nakazato et al. | 438/457 |
| 5,386,796 A | * | 2/1995 | Fusegawa et al. | 117/13 |
| 5,686,364 A | * | 11/1997 | Ohki et al. | 438/406 |

(Continued)

FOREIGN PATENT DOCUMENTS

EP    0798092 A2    10/1997

(Continued)

OTHER PUBLICATIONS

SEMI M1.15-0302 ("SEMI"), "Standard for 300 mm polished monocrystalline silicon wafer."*

(Continued)

*Primary Examiner*—Ahmed Sefer
(74) *Attorney, Agent, or Firm*—Hogan & Hartson LLP (57) ABSTRACT

The present invention provides a single crystal wafer, wherein the main surface has a plane or a plane equivalent to a plane tilting with respect to a [100] axis of single crystal by angles of α (0°<α<90°) for the [011] direction, β (0°<β<90°) for the [01-1] direction and γ (0°≦γ<45°) for the [10-1] or [101] direction. Thus, a single crystal wafer that can sufficiently bear device production processes even with a small wafer thickness is provided and thereby loss of single crystal raw material is reduced. Further, by using such a wafer, MIS type semiconductor devices and solar cells are provided at a low cost.

8 Claims, 4 Drawing Sheets

U.S. PATENT DOCUMENTS

| | | | |
|---|---|---|---|
| 5,875,769 A | | 3/1999 | Toyama et al. |
| 6,045,626 A | * | 4/2000 | Yano et al. ............... 148/33.4 |
| 6,066,516 A | * | 5/2000 | Miyasaka ................. 438/149 |
| 6,429,035 B2 | * | 8/2002 | Nakagawa et al. ........... 438/57 |
| 6,547,875 B1 | * | 4/2003 | Nakajima et al. ............ 117/13 |
| 6,580,151 B2 | * | 6/2003 | Vandeputte et al. ......... 257/618 |
| 2001/0032977 A1 | * | 10/2001 | Abe et al. .................... 257/15 |
| 2001/0051387 A1 | * | 12/2001 | Nakagawa et al. ........... 438/57 |
| 2002/0014666 A1 | * | 2/2002 | Ohmi et al. ................ 257/368 |

FOREIGN PATENT DOCUMENTS

| | | | |
|---|---|---|---|
| JP | 53-89367 | * | 8/1978 |
| JP | 53-089367 | | 8/1978 |
| JP | 56-109896 | | 8/1981 |
| JP | 62-065996 | | 3/1987 |
| JP | 62-226891 | * | 10/1987 |
| JP | 02-133926 | | 5/1990 |
| JP | 2-133926 | * | 5/1990 |
| JP | 02-180796 | | 7/1990 |
| JP | 3-61634 | | 9/1991 |
| JP | 5-90117 | * | 4/1993 |
| JP | 05-343321 | | 12/1993 |
| JP | 05-347256 | | 12/1993 |
| JP | 7-284646 | * | 10/1995 |
| JP | 08-026891 | | 1/1996 |
| JP | 09-262825 | | 10/1997 |
| JP | 9-312258 | * | 12/1997 |
| JP | 11-162973 | * | 6/1999 |
| JP | 2000-150512 | * | 5/2000 |
| JP | 2002-228 | * | 8/2000 |

OTHER PUBLICATIONS

Watanbe et al., "450 mm silicon: An opportunity and wafer scaling," The electrochemical society interface, 2006.*

Jester, "Specific PVMAT R&D on Siemens CZ silicon product manufacturing", Photvoltaic Specialists Conference, 2000, pp. 1399-1402.*

Mitchell et al., "The Reformation of Cz Si Photovoltaics," IEEE Photvoltaic Specialists Conference, 1994, pp. 1266-1269.*

Yuji Saito et al., "Advantage of Radical Oxidation for Improving Reliability of Ultra-Thin Gate Oxide", 2000 Symposium on VLSI Technology Digest of Technical Papers, Jun. 13-15, 2000. pp. 176-177.

Fumio, Shimura, "Semiconductor Silicon Crystal Technology", Academic Press, Inc. pp. 23-55.

Duane O. Townley, "Optimum Crystallographic Orientation For Silicon Device Fabrication," Solid State Technology, Pennwell Corporation, Tulsa, OK, US, vol. 16, No. 1, 1973, pp. 43-47.

European Search Report for corresponding European application No. 01947892.4-2122 lists the references above.

* cited by examiner

ABSTRACT

SINGLE CRYSTAL WAFER AND SOLAR BATTERY CELL

TECHNICAL FIELD

The present invention relates to a single crystal wafer used for device production processes, which can have a smaller thickness compared with conventional wafers, a MIS type semiconductor device and solar cell utilizing the wafer.

BACKGROUND ART

Single crystal wafers, of which typical examples are those of silicon (Si) and gallium arsenide (GaAs), are obtained by slicing a single crystal ingot produced by the Czochralski method (CZ method) or the floating zone method (FZ method) into wafers. Therefore, it is desired to obtain wafers as many as possible from one ingot by making thickness of wafer as small as possible or reducing the stock removal for slicing. That is, desirability of reducing thickness of wafers or processing loss in the production of wafers to reduce waste of the raw material and thereby reduce production cost of wafers has hitherto been widely recognized.

However, if thickness of wafer is simply reduced, it becomes likely that breakage or chipping occurs in the wafer production process or device production process. Therefore, it is considered that wafers must have a certain thickness (for example, about 700 to 800 μm in the case of a silicon wafer having a diameter of 200 mm). Further, since a limitation is imposed on the reduction of stock removal for slicing by slicing apparatus, the reduction of stock removal for slicing suffers from a certain limit.

Furthermore, loss of the raw material is generated not only in the wafer production process, but also in the device production process. Since the final thickness of wafer actually mounted as a chip is about 100 to 200 μm, a step of reducing the thickness from the back surface (back lap) is used, and thus the raw material is wasted also in this step.

Meanwhile, a gate insulator film of MIS (metal/insulator film/silicon) type transistor mainly produced by using a silicon single crystal wafer is required to have highly efficient electric characteristics and high reliability such as low leakage current characteristic, low interface state density and high carrier injection resistance. As a technique for forming a gate insulator film satisfying these requirements, there has conventionally been utilized the thermal oxidation technique using oxygen molecules or water molecules at 800° C. or higher. Conventionally, in order to obtain good oxide film/silicon interface characteristics, oxide dielectric breakdown voltage characteristic and leakage current characteristic by using the thermal oxidation technique, there must be used a silicon wafer having a {100} plane for the surface or a silicon wafer having a plane orientation tilting by about 4° from a {100} plane of a single crystal.

If a gate oxide film is formed on a silicon wafer having a plane orientation other than those mentioned above by using the thermal oxidation technique, electric characteristics are degraded, that is, the interface state density of oxide film/silicon interface becomes high, the oxide dielectric breakdown voltage characteristic and leakage current characteristic are degraded and so forth. Therefore, as a silicon wafer on which semiconductor devices such as MIS type transistors are formed, a silicon wafer having a {100} plane for the surface or a silicon wafer having a plane orientation tilting by about 4° from a {100} plane of a single crystal has conventionally been used.

However, in a silicon wafer having a {100} plane for the surface, a {110} plane serving as a cleavage plane exists perpendicularly to the surface. Thus, breakages, chipping, slip dislocations and so forth are likely to be caused during the process. Therefore, a usually used silicon wafer having a {100} plane for the surface has a thickness of about 700 to 800 μm for a diameter of 200 mm or a thickness of about 600 to 700 μm for a diameter of 150 mm, and the same shall apply to a silicon wafer having a plane orientation tilting by about 4° from a {100} plane of a single crystal.

Recently, a technique was developed for forming an insulator film of good quality irrespective of the plane orientation of silicon wafer surface (refer to 2000 Symposium ON VLSI Technology, Honolulu, Hi., Jun. 13-15, 2000 "Advantage of Radical Oxidation for Improving Reliability of Ultra-Thin Gate Oxide"). Therefore, it can be said that, thanks to such a technique, it became unnecessary to limit the plane orientation of wafer for the production of MIS type semiconductor devices to the {100} surface.

DISCLOSURE OF THE INVENTION

Therefore, to effectively utilize the aforementioned technique of forming an insulator film of good quality irrespective of the plane orientation, an object of the present invention is to provide a single crystal wafer that can bear the device production process to a degree comparable to those attained conventional wafers even with a smaller thickness of the water compared with those of the conventional wafers on the basis of relationship between plane orientation and likeliness of breakage, and thereby reduce loss of single crystal. Another object of the present invention is to provide an MIS type semiconductor device or a solar cell, of which major problem is reduction of production cost, at a low cost by utilizing a silicon wafer having such a plane orientation unlikely to cause breakage.

The present invention that achieves the aforementioned objects provides a single crystal wafer, wherein the main surface has a plane or a plane equivalent to a plane tilting with respect to a [100] axis of single crystal by angles of $\alpha$ ($0°<\alpha<90°$) for the [011] direction, $\beta$ ($0°<\beta<90°$) for the [01-1] direction and $\gamma$ ($0°\leq\gamma<45°$) for the [10-1] or [101] direction.

Since the surface of such a single crystal wafer has a plane orientation tilting with respect to all the {110} planes, at which cleavage is likely to occur, it becomes more unlikely to suffer from breakage due to an external stress compared with a conventional single crystal wafer having a {100} plane. Thus, wafers having a thickness smaller than those of conventional wafers can be produced. Therefore, number of wafers that can be produced from one single crystal ingot is increased, and it becomes possible to reduce the cost.

The single crystal wafer of the present invention may consist of semiconductor silicon.

If the single crystal wafer consists of semiconductor silicon as described above, the effect of the reduction of production cost become extremely significant, since semiconductor silicon is the most widely used semiconductor at present.

The aforementioned single crystal wafer may satisfy a relationship of thickness of wafer (μm)/diameter of wafer (mm) $\leq 3$.

Since the single crystal wafer of the present invention can have excellent mechanical strength as described above, it can be such an wafer having an extremely thin wafer thickness relative to diameter of the wafer that it should satisfy the relationship of thickness of wafer (μm)/diameter of wafer (mm) $\leq 3$, which cannot be realized by the conventional techniques. Therefore, the effect provided by the reduction of production cost becomes more significant.

In the single crystal wafer of the present invention, an insulator film is preferably formed on the surface of the single crystal wafer.

If an insulator film is formed on at least one surface of the single crystal wafer of the present invention as described above, cleavage of the wafer can be suppressed. If the insulator film is formed all over the wafer, the effect of suppressing the cleavage becomes more significant. Further, MIS semiconductor devices, for example, can be produced by using such a wafer, and thus the devices can be produced on a thin wafer that is unlikely to break at a low cost.

In this case, the aforementioned insulator film is preferably a silicon oxide film containing Kr, or the aforementioned insulator film is preferably a silicon nitride film containing Ar or Kr and hydrogen.

If the insulator film is a silicon oxide film containing Kr or a silicon nitride film containing Ar or Kr and hydrogen as described above, an insulator film of good quality can be obtained irrespective of the plane orientation.

Furthermore, a solar cell can be produced by using the single crystal wafer of the present invention described above.

Solar cells have not used so widely because of the high production cost thereof. Therefore, if the wafer of the present invention that has higher strength and enables processing of thin silicon single crystal is used, the production cost of solar cells can be reduced and it provides great advantages.

As described above, the single crystal wafer of the present invention can be a single crystal wafer that can bear the device production process to a degree comparable to those attained by conventional wafers even with a smaller thickness of the water compared with those of the conventional wafers. Therefore, loss of the single crystal raw material can be markedly reduced compared with conventional techniques, and by using such a silicon wafer, an MIS type semiconductor device or a solar cell, of which major problem is reduction of production cost, can be provided at a low cost.

BEST MODE FOR CARRYING OUT THE INVENTION

Hereafter, the present invention will be explained in more detail.

As described above, in response to the development of a technique for forming an insulator film of good quality irrespective of the plane orientation of silicon wafer surface, the inventors of the present invention noted the relationship between the plane orientation and likeliness of breakage of wafer in order to utilize the technique. That is, since it became unnecessary to limit the plane orientation for the device characteristics, they conceived that, if a plane orientation providing strength as high as possible was selected, wafers causing breakage or chipping at a level comparable to those attained by conventional wafers could be obtained even if the wafers were produced with a smaller thickness compared with those of the conventional wafers, and as a result, number of wafers obtainable from one ingot could be increased.

Meanwhile, as for the plane orientation of silicon wafers on which devices are produced, while low index planes such as {100} plane and {111} plane have been used from old days, wafers having a plane orientation tilting from such plane orientation have also been used. For example, the inventions disclosed in Japanese Patent Laid-open Publication (Kokai) No. 56-109896, Japanese Patent Publication (Kokoku) No. 3-61634 and Japanese Patent Laid-open Publication No. 8-26891 use planes tilting from a {100} plane or {111} plane by several degrees for one {110} plane. However, these planes tilt for only one {110} plane, and the wafers cannot be said to be wafers that are unlikely to break. Moreover, those techniques relate to prevention of generation of process-induced crystal defects or prevention of generation of defects during epitaxial growth.

Further, Japanese Patent Laid-open Publication No. 9-262825 discloses that, as for the relationship between the plane orientation and likeliness of breakage of wafer, when a single crystal is sliced with a wire saw, wafers are likely to suffer from breakage if a saw mark conforms to the cleavage direction. However, the cleavage plane considered in this reference is only the {110} plane orthogonal to the {100} plane, and the {110} plane having an angle of 45° with respect to the {100} plane is not considered at all. Thus, all the sliced wafers are wafers having a low index plane such as {100} plane.

The inventors of the present invention conceived that, in order to produce a wafer unlikely to break, consideration of only the {110} plane perpendicular to the {100} plane was insufficient, and it was necessary to consider the {110} plane having an angle of 45° with respect to the {100} plane. Thus, the present invention was accomplished.

Hereafter, the present invention will be explained by referring to the appended drawings. However, the present invention is not limited to these explanations.

Figure 1:
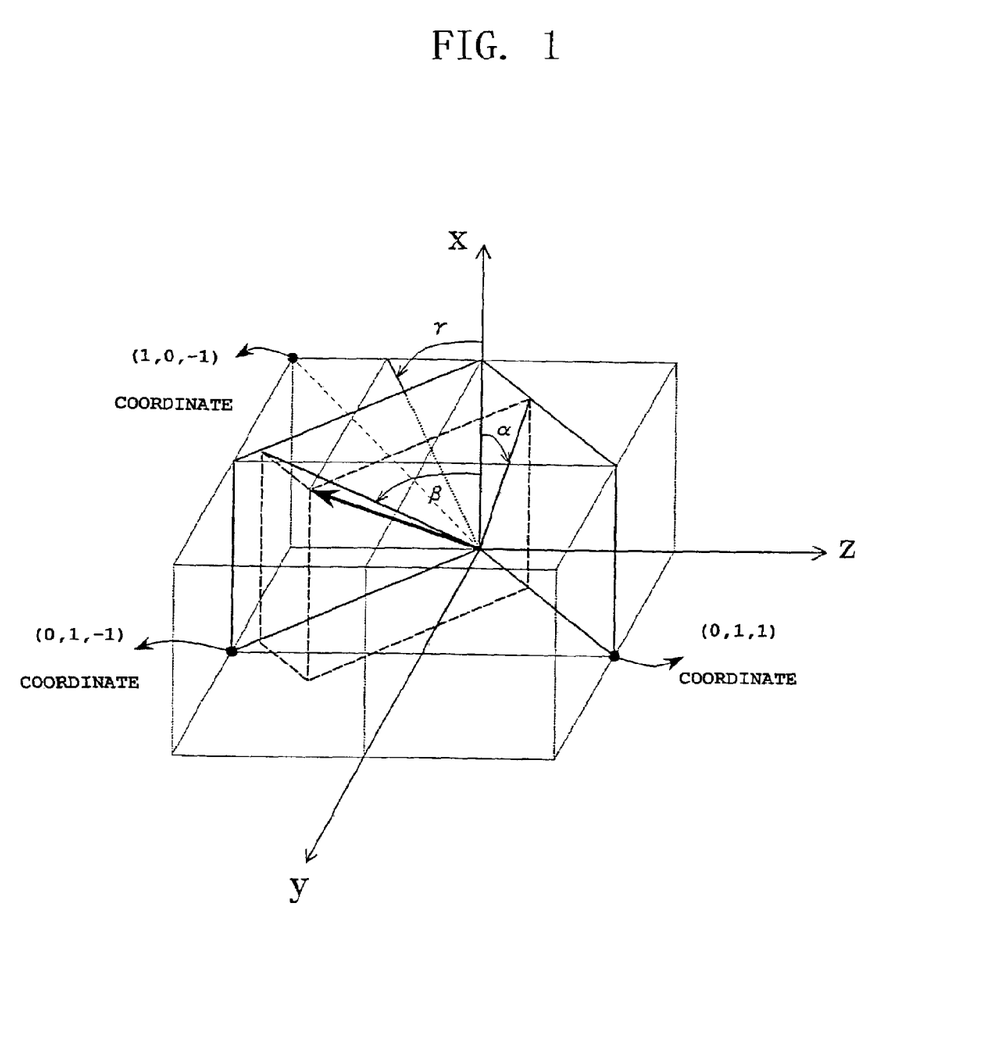
FIG. 1 is an explanatory diagram for explaining plane orientation of the single crystal wafer of the present invention.

FIG. 1 is a diagram for explaining plane orientation of the single crystal wafer of the present invention. The arrowhead (vector) represented by the bold line in FIG. 1 indicates the plane orientation of the single crystal wafer of the present invention (orientation of the normal of the wafer surface). It has, with respect to the [100] axis (X-axis), tilting angles of $\alpha$ ($0°<\alpha<90°$) for the [011] direction, $\beta$ ($0°<\beta<90°$) for the [01-1] direction and $\gamma$ ($0°\leq\gamma<45°$) for the [10-1] direction.

That is, the single crystal wafer having this plane orientation will have a plane tilting by angles of $\alpha$, $\beta$ and $\gamma$ from the cleavage planes, (011) plane, (01-1) plane and (10-1) plane, respectively, and thus mechanical strength of the wafer with respect to an external stress is increased compared with conventional wafers having a low index plane orientation.

In this case, if $\alpha=\beta$, $\gamma$ becomes 0°. If a cross section of a wafer having such a tilting plane is observed from the [010] direction, the cleavage planes, the (10-1) plane and (101) plane, are bilaterally symmetrical planes having an angle of 45° with respect to the (100) plane, respectively. Therefore, if the number of effective bonds of the crystal does not show significant difference for all of the plane orientations, it is considered that the strength becomes highest when $\gamma=0°$. However, it is considered that actual strength is determined by both of the plane orientation and number of effective bonds, and thus $\gamma$ of 0° cannot be said to be always optimal since the number of effective bonds differs depending on the plane orientation. Therefore, even when $\gamma$ satisfies the condition of $0°<\gamma<45°$, high strength can be obtained. Incidentally, it is known that the numbers of effective bonds in the case of silicon single crystal are $11.8 \times 10^{14}$ numbers/cm², $9.6 \times 10^{14}$ numbers/cm² and $6.8 \times 10^{14}$ numbers/cm² for the (111), (110) and (100) planes, respectively.

Further, when $\alpha<\beta$, $\gamma$ does not mean an tilting angle for the [10-1] direction shown in FIG. 1, but means a tilting angle for the [101] direction.

In addition, as a plane orientation equivalent to that of the single crystal wafer shown in FIG. 1, there are three planes in the directions corresponding to those obtained by revolving the vector shown in FIG. 1 by 90° at a time on the y-z plane.

In order to produce a wafer having such a particular tilting plane, a single crystal ingot produced under ordinary condition can be sliced with a predetermined angle. In the case of silicon single crystal, ingots ordinarily produced have a crystal orientation of <100> or <111>, and <110> and <511> are known as crystal orientations that enable crystal production without causing unacceptable deformation of crystal. Further, by using a seed crystal preliminarily provided with an off angle of several degrees or so as a seed crystal used at the time of pulling a single crystal, a crystal having an off angle can be pulled. Therefore, by using such a crystal, adjustment of the orientation at the time of slicing can also be simplified.

Since the surface of the single crystal wafer of the present invention described above has a plane orientation tilting from all of the {110} planes along which cleavage is likely to occur, a wafer that is more unlikely to break with an external stress and has a smaller thickness compared with conventional wafers having {100} planes can be produced.

For example, when a single crystal wafer is produced from semiconductor silicon, it is necessary to produce a wafer having a thickness of about 700 to 800 μm in the case of a conventional silicon wafer having a diameter of 200 mm. However, in the single crystal wafer of the present invention, the thickness can be made thinner than the above, and it is also possible to obtain a thickness of less than 600 μm in the case of a silicon wafer having a diameter of 200 mm, for example. Therefore, number of wafers that can be produced from one single crystal ingot is increased, and it becomes possible to reduce the production cost.

Hereafter, the method for forming a gate insulator film required for MIS type semiconductor devices by using a silicon wafer having such a tilting plane (referred to as "(abc) plane" hereinafter) will be explained.

If an insulator film is formed by the method described below, an insulator film having characteristics as a gate insulator film comparable to those of conventional films and showing no dependency on the plane orientation can surely be formed.

Figure 2:
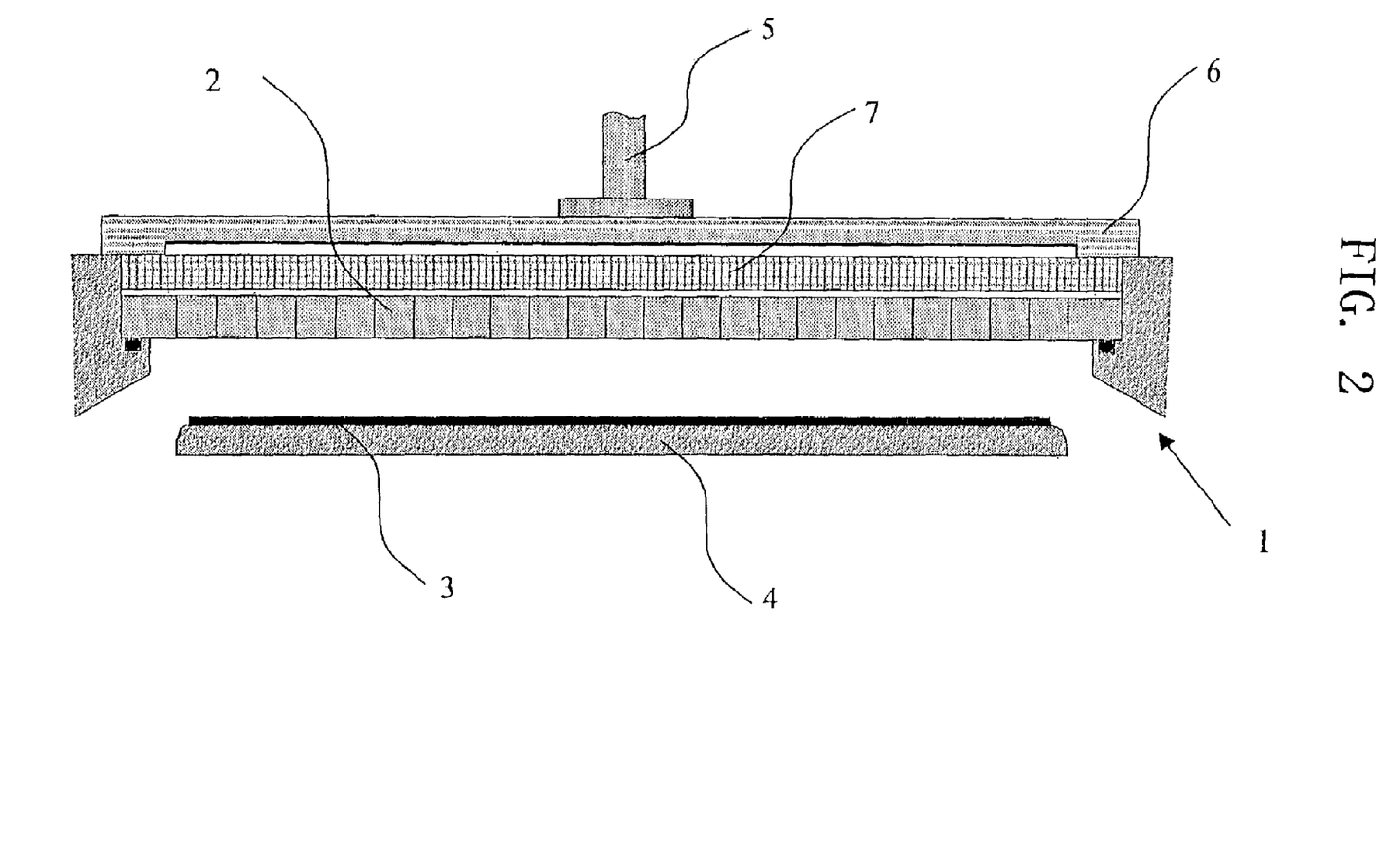
FIG. 2 shows an exemplary apparatus utilizing a radial line slot antenna for forming an oxide film on the single crystal wafer of the present invention.

FIG. 2 shows an exemplary apparatus utilizing a radial line slot antenna for forming an oxide film on the single crystal wafer of the present invention. This embodiment has a novel characteristic that Kr is used as plasma excitation gas for the oxide film formation. Inside of a vacuum chamber (processing chamber) 1 is made vacuum, and Kr gas and $O_2$ gas are introduced from a shower plate 2 to adjust the pressure in the processing chamber to be about 1 Torr (about 133 Pa).

A circular substrate 3 such as a silicon wafer is placed on a sample stand 4 having a heating mechanism, and temperature is adjusted so that the temperature of the sample should become 400° C. This temperature may be in the range of 200 to 550° C. From a coaxial wave guide 5, a microwave of 2.45 GHz is supplied to the processing chamber via a radial line slot antenna 6 and a dielectric plate 7 to generate high density plasma in the processing chamber. Further, any frequency of the supplied microwave may be selected so long as it is in the range of 900 MHz to 10 GHz.

A spacing between the shower plate 2 and the substrate 3 is adjusted to 6 cm in this embodiment. A narrower spacing enables film formation with a higher rate. Although an example of film formation using a plasma apparatus utilizing a radial line slot antenna was shown in this embodiment, a microwave may be introduced into the processing chamber by using another method.

In the high density excitation plasma in which Kr gas and $O_2$ gas are mixed, Kr* and $O_2$ molecules in an intermediate excited state collide each other, and thus atomic oxygen O* generates efficiently. The substrate surface is oxidized with this atomic oxygen. The conventional oxidation of silicon surface is attained by $H_2O$ molecules and/or $O_2$ molecules, and the treatment temperature is extremely high, i.e., 800° C. or higher. However, the oxidation by atomic oxygen according to the present invention may be realized at a sufficiently low temperature, i.e., 550° C. or lower.

Although higher pressure in the processing chamber is desirable for increasing occasions of collision of Kr* and $O_2$, O* will collide each other and return into a $O_2$ molecule at an unduly high pressure. The inventors of the present invention measured thickness of oxide film grown by oxidation treatment of 10 minutes at a silicon substrate temperature of 400° C. with keeping pressure ratios of 97% for Kr and 3% for oxygen in the processing chamber and a varying gas pressure in the processing chamber. As a result, the thickness of oxide film became the largest when the gas pressure in the processing chamber was 1 Torr, and thus it was found that oxidation condition of that pressure or pressure around that was preferred. It was found that this pressure condition was similarly preferred for the (abc) plane as well as the (100) plane and the (111) plane.

Figure 3:
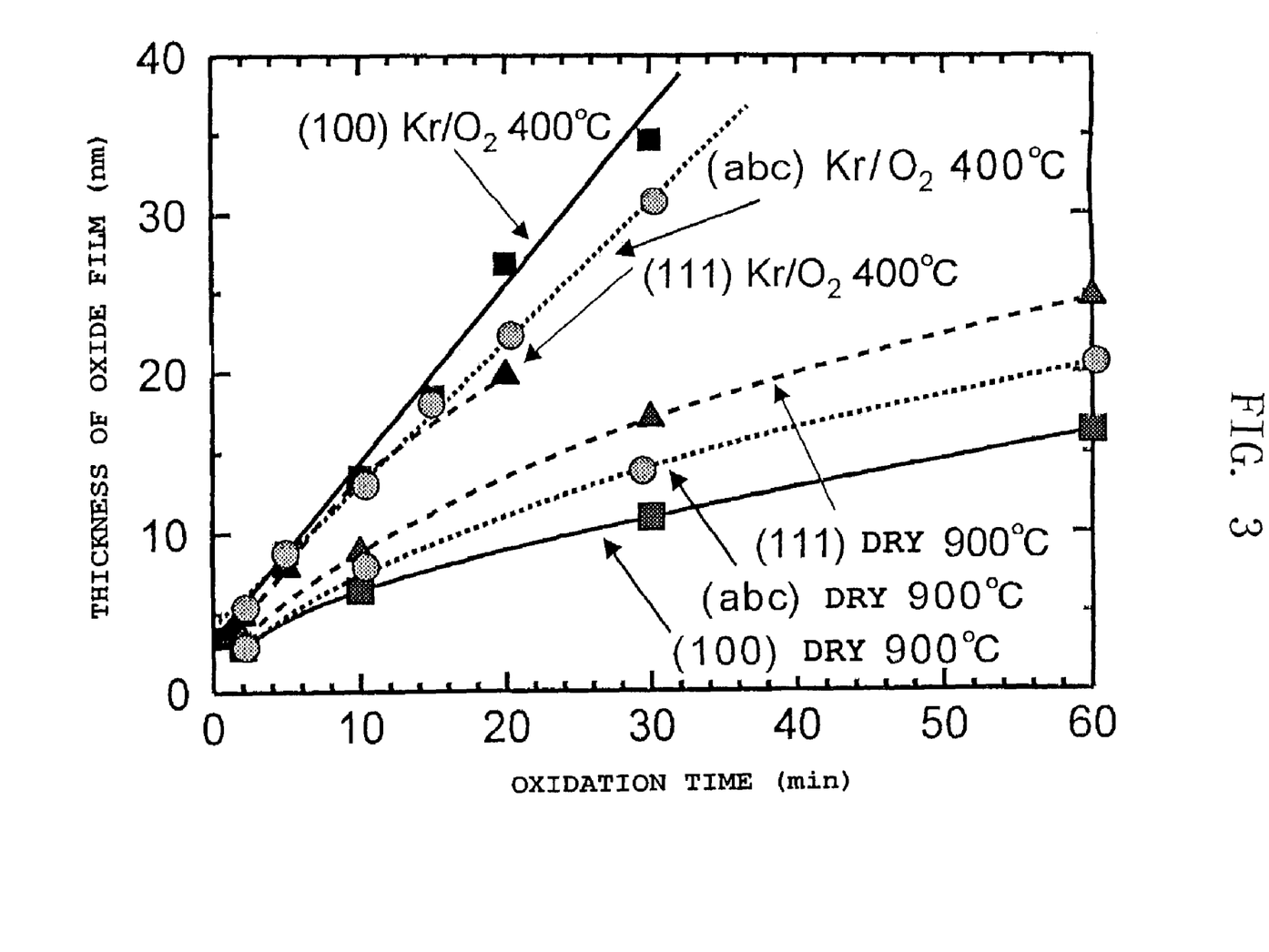
FIG. 3 is a graph showing a relationship between oxide film thickness containing Kr and oxidation time during oxidation of silicon wafer surface using $Kr/O_2$ high density plasma.

FIG. 3 shows a relationship between oxide film thickness containing Kr and oxidation time during oxidation of silicon wafer surface using Kr/$O_2$ high density plasma. The graph shows the results for silicon substrates having a plane orientation of (100) plane, (111) plane or (abc) plane. FIG. 3 also shows oxidation time dependency in conventional dry thermal oxidation at 900° C. It is evident that the oxidation rate in the Kr/$O_2$ high density plasma oxidation at a substrate temperature of 400° C. and a processing chamber pressure of 1 Torr is higher than the oxidation rate in the dry $O_2$ oxidation at a substrate temperature of 900° C. and atmospheric pressure.

By using the silicon substrate surface oxidation with Kr/$O_2$ high density plasma, the productivity of surface oxidation technique can also be markedly improved. In the conventional high temperature oxidation technique, $O_2$ molecules or $H_2O$ molecules pass through an oxide film formed on a surface by diffusion and reach the interface of silicon/silicon oxide film to contribute to the oxidation. Therefore, it is a common knowledge that the oxidation rate is rate-determined by the diffusion rates of $O_2$ molecules or $H_2O$ molecules through the oxide film, and it increases with a factor of $t^{1/2}$ as a function of oxidation time t. However, in the Kr/$O_2$ high density plasma oxidation according to the present invention, the oxidation rate is linear until the oxide film thickness reaches 35 nm. This means that the diffusion rate of atomic oxygen in the silicon oxide film is extremely high, and atomic oxygen can freely pass through the silicon oxide film.

Kr density distribution along the depth direction in a silicon oxide film formed by the aforementioned procedure was investigated by using a total reflection X-ray fluorescence spectrophotometer. Kr density decreased in a region having a thinner oxide film thickness, and Kr existed at a density of about $2\times10^{11}$ cm$^{-2}$ at a silicon oxide film surface. That is, in this silicon film, the Kr concentration in the film is constant for the film thickness of 4 nm or more, and the Kr concentration decreases towards the silicon/silicon oxide film interface.

Figure 4:
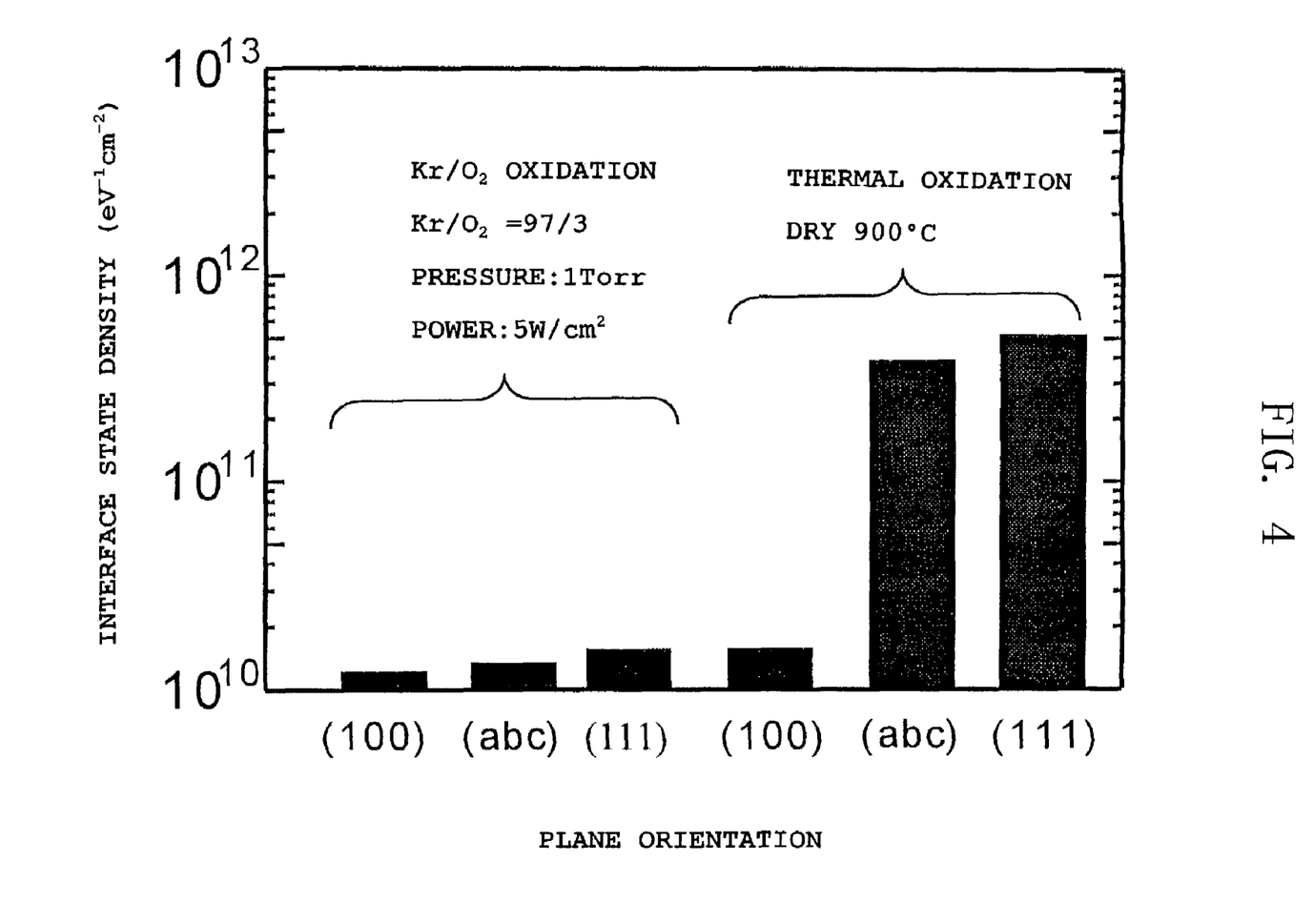
FIG. 4 is a graph showing the results of low frequency C-V measurement for interface state density of oxide film.

FIG. 4 shows the results of low frequency C-V measurement for interface state density of an oxide film. The silicon oxide film was formed at a substrate temperature of 400° C. by using the apparatus shown in FIG. 2. The partial pressure of oxygen in rare gas was fixed to 3%, and the pressure in the processing chamber was fixed to 1 Torr. For comparison, the interface state density of a thermal oxide film formed at 900° C. in an atmosphere of 100% oxygen is also shown. The interface state density of the oxide film formed by using Kr gas was low for all of the (100) plane, (111) plane and (abc) plane and equivalent to the interface state density of the thermal oxide film formed at 900° C. in a dry oxidation atmosphere so as to have a (100) plane. Thus, it can be seen that an oxide film of good quality showing a low interface state density can similarly be obtained for the (abc) plane. In addition, the interface state density of the thermal oxide film formed with the (111) plane is larger by 1 digit order compared with them. The interface state density referred to in the present invention means interface trap density (Dit) in the mid gap, and it is obtained by the quasi-static C-V technique (quasi-static capacitance-voltage technique).

As for electric characteristics and reliability characteristics of the oxide film such as dielectric breakdown voltage, leakage characteristic, hot carrier resistance and charge quantity causing breakdown of silicon oxide film upon flowing a stress current, QBD (Charge-to-Breakdown), the oxide film obtained by the silicon substrate surface oxidation using $Kr/O_2$ high density plasma showed favorable characteristics comparable to those obtained for the oxide film obtained by the thermal oxidation at 900° C.

As described above, although the oxide film grown with the $Kr/O_2$ high density plasma was oxidized at a low temperature of 400° C., it showed characteristics comparable to or superior to those shown by the conventional oxide film of a (100) plane obtained by the high temperature thermal oxidation, even for the (abc) plane, without being influenced by the plane orientation. These advantages are partly provided by Kr contained in the oxide film. It is considered that when Kr is contained in the oxide film, stress in the film or at the $Si/SiO_2$ interface is relaxed, charges in the film and the interface state density are reduced, and thereby the electric characteristics of the silicon oxide film are markedly improved. It is considered that, in particular, Kr contained at a level of $5\times10^{11}$ cm$^{-2}$ or less in the concentration of the surface contributes to the improvements of the electric characteristics and reliability characteristics of the silicon oxide film.

The MIS transistor utilizing this gate oxide film shows favorable characteristics in any plane orientation, and characteristics equivalent to those obtained with the (100) plane can be obtained even with the (abc) plane.

In addition, in order to produce the oxide film of the present invention, other than the apparatus shown in FIG. 2, an apparatus for plasma process that enables low temperature oxide film formation using plasma may also be used.

For example, an oxide film can also be formed by a two-stage shower plate type plasma process apparatus having first gas discharging means for discharging Kr gas for exciting plasma by a microwave and second gas discharging means for discharging oxygen gas, which is different from the first gas discharging means.

Hereafter, low temperature nitride film formation using plasma will be explained. A nitride film forming apparatus is almost the same as the apparatus shown in FIG. 2. In this embodiment, Ar or Kr is used as plasma excitation gas for the nitride film formation. Inside of the vacuum chamber (processing chamber) 1 is made vacuum, and Ar gas and $NH_3$ gas are introduced from the shower plate 2 to adjust the pressure in the processing chamber to be about 100 mTorr. A circular substrate 3 such as a silicon wafer is placed on the sample stand 4 having a heating mechanism, and temperature is adjusted so that the temperature of the sample should become 500° C. This temperature may be adjusted to be in the range of about 200 to 550° C.

From the coaxial wave guide 5, a microwave of 2.45 GHz is supplied to the processing chamber via the radial line slot antenna 6 and the dielectric plate 7 to generate high density plasma in the processing chamber. The frequency of the supplied microwave may be in the range of 900 MHz to 10 GHz. A spacing between the shower plate 2 and the substrate 3 is adjusted to 6 cm in this example. A narrower spacing enables film formation with a higher rate.

Although an example of film formation using a plasma apparatus utilizing a radial line slot antenna was shown in this embodiment, a microwave may be introduced into the processing chamber by using another method. Further, although Ar is used as the plasma excitation gas, use of Kr can also provide similar results. Furthermore, although $NH_3$ is used as the plasma process gas, a mixed gas of $N_2$ and $H_2$ or the like may also be used.

In the high density excitation plasma of a mixed gas of Ar or Kr and $NH_3$ (or $N_2$, $H_2$), NH* radicals are efficiently generated by Ar* or Kr* in an intermediate excited state. With these NH* radicals, the substrate surface is nitrided. Such nitriding of silicon enables formation of nitride film of high quality at a low temperature without limitation of the plane orientation of silicon.

In the silicon nitride film formation according to the present invention, one of the important requirements is the presence of hydrogen. When hydrogen exists in the plasma, dangling bonds in the silicon nitride film or at the interface form Si—H and N—H bonds to cause termination, and as a result, electronic traps in the silicon nitride film and at the interface are eliminated. The presence of the Si—H bonds and N—H bonds in the nitride film of the present invention has been confirmed by infrared absorption spectrometry and X-ray photoelectron spectrometry of the film. The presence of hydrogen also eliminates the hysteresis of CV characteristics and suppresses the silicon/silicon nitride interface state density as low as $3 \times 10^{10}$ eV$^{-1}$ cm$^{-2}$. In the formation of the silicon nitride film by using a rare gas (Ar or Kr) and a mixed gas of $N_2/H_2$, if the hydrogen gas is used at a partial pressure of 0.5% or more, electron and hole traps in the film are sharply decreased.

Relative dielectric constant of the silicon nitride film of this embodiment was 7.9, which is twice as large as that of the silicon oxide film.

In order to produce the nitride film of the present invention, other than the apparatus shown in FIG. 2, an apparatus for plasma process that enables low temperature nitride film formation using plasma may also be used. For example, the nitride film can also be formed by a two-stage shower plate type plasma process apparatus having first gas discharging means for discharging Ar or Kr gas for exciting plasma by a microwave and second gas discharging means for discharging $NH_3$ (or $N_2/H_2$ gas) gas, which is different from the first gas discharging means.

Hereafter, a method for producing a solar cell by using a silicon wafer having an (abc) plane such as the wafer of the present invention will be explained.

As already described, a silicon wafer having an (abc) plane as the main surface shows high mechanical strength. Therefore, it becomes possible to slice a silicon single crystal ingot for solar cells with a thickness smaller than the thickness used in the slicing of conventional silicon single crystal ingot for solar cells (about 400 to 600 μm for a diameter of 100 to 150 mm), and the thickness can be, for example, 300 to 450 μm or less than the foregoing range for a diameter of 100 to 150 mm. Therefore, the yield of wafers is improved for the thickness made thinner, and thus it becomes possible to reduce the cost.

The slicing is performed by using a wire saw or an inner diameter slicer, and damage is generated in a crystal by mechanical impact at the time of the slicing. Such damage degrades electric characteristics of wafers and also affect characteristic of the cell. Therefore, in order to eliminate such a damage layer, chemical etching is performed for about 10 to 20 μm. Such etching is usually performed by using a mixed acid of HF and $HNO_3$, and several tens of wafers are put into a carrier for etching to perform the etching with rotating the carrier in order to attain uniform etching over the surfaces. Therefore, higher wafer strength is advantageous for such an etching process, since wafers are unlikely to break even with a small thickness. Further, etching with an alkali for increasing conversion efficiency, called texture treatment, is also performed.

Then, since a p-type silicon wafer is usually used, n-type impurities are diffused in the wafer to form a pn junction, and the wafer is subjected to formation of electrodes and formation of antireflection film to produce a solar cell.

By successively forming a n-type layer, p-type layer and n-type layer on a surface of a p-type wafer by epitaxial growth to produce a pnpn type tandem structure, a conversion efficiency of 20% or more and an output voltage of 1.5 V can be attained.

As described above, the wafer of the present invention having the (abc) plane as the main surface can sufficiently bear the production steps of devices and solar cells even with a smaller thickness, and thus it enables marked reduction of the production cost.

The present invention is not limited to the embodiments described above. The above-described embodiments are mere examples, and those having the substantially same structure as that described in the appended claims and those providing similar functions and advantages are all included in the scope of the present invention.

For example, while single crystal wafers consisting of semiconductor silicon are exemplified in the aforementioned embodiments, the present invention is not limited to these and can be applied to single crystals other than silicon and compound semiconductors, and such application also falls within the scope of the present invention.

The invention claimed is:

1. A semiconductor silicon single crystal wafer, wherein the main surface of the semiconductor silicon single crystal wafer has a plane or a plane equivalent to a plane tilting with respect to a [100] axis of single crystal by angles of α (0°<α<90°) for the [011] direction, β (0°<β<90°) for the [01-1] direction and γ (0°<γ<45°) for the [10-1] or [101] direction, the diameter of the wafer is not less than 100 mm and not more than 200 mm, and the wafer satisfies a relationship of 2≦ thickness of wafer (μm)/diameter of wafer (mm) ≦3.

2. A single crystal wafer, wherein an insulator film is formed on a surface of the single crystal wafer according to claim 1.

3. The single crystal wafer according to claim 2, wherein the insulator film is a silicon oxide film containing Kr.

4. A solar cell produced by using the single crystal wafer according to claim 3.

5. The single crystal wafer according to claim 2, wherein the insulator film is a silicon nitride film containing Ar or Kr and hydrogen.

6. A solar cell produced by using the single crystal wafer according to claim 5.

7. A solar cell produced by using the single crystal wafer according to claim 2.

8. A solar cell produced by using the single crystal wafer according to claim 1.

\* \* \* \* \*